(12) United States Patent
Huang et al.

(10) Patent No.: US 9,806,146 B2
(45) Date of Patent: Oct. 31, 2017

(54) SEMICONDUCTOR DEVICE (71) Applicant: MEDIATEK INC., Hsin-Chu (TW)

(72) Inventors: Bo-Shih Huang, Hsinchu (TW);
Chien-Hui Chuang, New Taipei (TW);
Cheng-Chou Hung, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/367,126

(22) Filed: Dec. 1, 2016

(65) Prior Publication Data
US 2017/0084685 A1 Mar. 23, 2017

Related U.S. Application Data (63) Continuation of application No. 14/548,298, filed on Nov. 20, 2014, now Pat. No. 9,543,377.

(51) Int. Cl.
| H01L 27/06 | (2006.01) |
| H01L 29/73 | (2006.01) |
| H01L 29/78 | (2006.01) |
| H01L 23/60 | (2006.01) |
| H01L 29/788 | (2006.01) |
| H01L 29/06 | (2006.01) |
| H01L 29/74 | (2006.01) |
| H01L 29/45 | (2006.01) |
| H01L 29/36 | (2006.01) |

(52) U.S. Cl.
CPC ...... *H01L 29/0603* (2013.01); *H01L 29/0657* (2013.01); *H01L 29/0688* (2013.01); *H01L 29/36* (2013.01); *H01L 29/45* (2013.01); *H01L 29/7436* (2013.01)

(58) Field of Classification Search
CPC ....... H01L 2924/00; H01L 2224/48091; H01L 2924/3011; H01L 2924/3025; H01L 2224/16225; H01L 2924/10253
USPC ................ 257/330, 526, 506, 557, E29.173; 438/133, 135, 200, 286
See application file for complete search history.

(56) References Cited

U.S. PATENT DOCUMENTS

| 5,455,436 A * | 10/1995 | Cheng | H01L 27/0262 257/356 |
| 6,249,414 B1 * | 6/2001 | Lee | H01L 27/0262 257/360 |
| 2003/0042498 A1 | 3/2003 | Ker | |
| 2004/0207020 A1 * | 10/2004 | Chen | H01L 27/0262 257/355 |

(Continued)

FOREIGN PATENT DOCUMENTS

KR 100942701 B1 2/2010

*Primary Examiner* — Kimberly Rizkallah
*Assistant Examiner* — Brian Turner
(74) *Attorney, Agent, or Firm* — Winston Hsu (57) ABSTRACT

A semiconductor device comprising a substrate is disclosed. The substrate comprises: a well of type one; a first doped region of type two, provided in the well of type one; a well of type two, adjacent to the well of type one; a first doped region of type one, doped in the well of type two; and a second doped region of type two, provided in the well of type one and the well of type two, not touching the first doped region of type two. The substrate comprises no isolating material provided in a current path formed by the first doped region of type two, the well of type one, the well of type two and the first doped region of type one.

20 Claims, 11 Drawing Sheets (56) References Cited

U.S. PATENT DOCUMENTS

| | | |
|---|---|---|
| 2005/0173727 A1 | 8/2005 | Manna |
| 2005/0270710 A1 | 12/2005 | Ker |
| 2007/0007545 A1 | 1/2007 | Salcedo |
| 2007/0262386 A1 | 11/2007 | Gossner |
| 2010/0301418 A1 | 12/2010 | Kim |
| 2011/0068365 A1 | 3/2011 | Huang |

* cited by examiner

SEMICONDUCTOR DEVICE

CROSS REFERENCE TO RELATED APPLICATION

This application is a continuation application of applicant's earlier application, Ser. No. 14/548,298, filed 2014 Nov. 20, and is included herein by reference.

BACKGROUND

Figure 1:
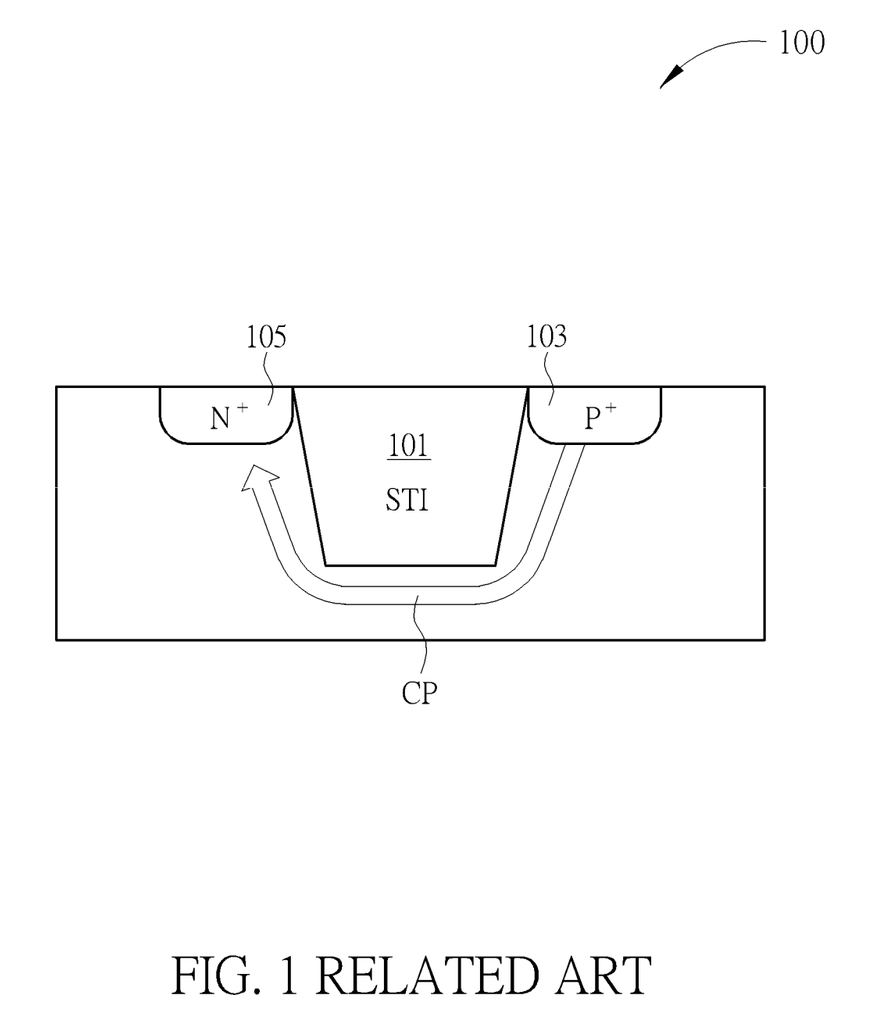
FIG. 1 is a semiconductor device with a STI for related art.

Conventionally, at least one STI (shallow trench insulator) is provided between a P doped region and an N doped region to separate the P doped region and the N doped region. FIG. 1 is a semiconductor device 100 with a STI 101 for related art. As shown in FIG. 1, a STI 101 is provided between a P doped region 103 and an N doped region 105. Therefore, a current path CP for transmitting currents from the P doped region 103 to the N doped region 105 must by-pass the STI 101 since materials of the STI 101 are not conductive. In such case, the current path CP is longer, such that the charge/discharge time for the semiconductor device is correspondingly extended, which may causes some disadvantages. For example, if the semiconductor device 100 is applied as an ESD device, the circuit protected by such device is easily broken since the semiconductor device 100 has a low discharge speed.

SUMMARY

Therefore, one objective of the present application is to provide a semiconductor device that can provide higher discharging speed.

One embodiment of the present application discloses a semiconductor device comprising a substrate. The substrate comprises: a well of type one; a first doped region of type two, provided in the well of type one; a well of type two, adjacent to the well of type one; a first doped region of type one, doped in the well of type two; and a second doped region of type two, provided in the well of type one and the well of type two, not touching the first doped region of type two. The substrate comprises no isolating material provided in a current path formed by the first doped region of type two, the well of type one, the well of type two and the first doped region of type one.

Another embodiment of the present application discloses a semiconductor device comprising a substrate. The substrate comprises: a well of type one; a first doped region of type two, provided in the well of type one; a well of type two, adjacent to the well of type one; and a first doped region of type one, doped in the well of type two. No silicide is provided on at least part of the well of type one adjacent to the first doped region of type two, and at least part of the first doped region of type two adjacent to the well of type one. The substrate comprises no isolating material provided in a current path formed by the first doped region of type two, the well of type one, the well of type two and the first doped region of type one.

In some embodiments, the first type is N type and the second type is P type. In other embodiments, the first type is P type and the second type is N type.

These and other objectives of the present invention will no doubt become obvious to those of ordinary skill in the art after reading the following detailed description of the preferred embodiment that is illustrated in the various figures and drawings.

DETAILED DESCRIPTION

FIG. 2 to FIG. 7 are top views and cross-sectional views for semiconductor devices according to embodiments of the present application. In the following embodiments, for the brevity of illustrating, a first type and a second type are applied to respectively indicate the N type or the P type. However, the first type and the second type indicate different meanings in different embodiments. In the embodiments of FIG. 2, FIG. 4, FIG. 6, FIG. 8(a), FIG. 9(a), FIG. 10(a), the first type indicates the N type, the second type indicates the P type. On the contrary, in the embodiments of FIG. 3, FIG. 5, FIG. 7, FIG. 8(b), FIG. 9(b), FIG. 10(b), the first type indicates the P type, the second type indicates the N type. Also, the following embodiment can be implemented by a SCR (Silicon Controlled Rectifier, but not limited.

Figure 2:
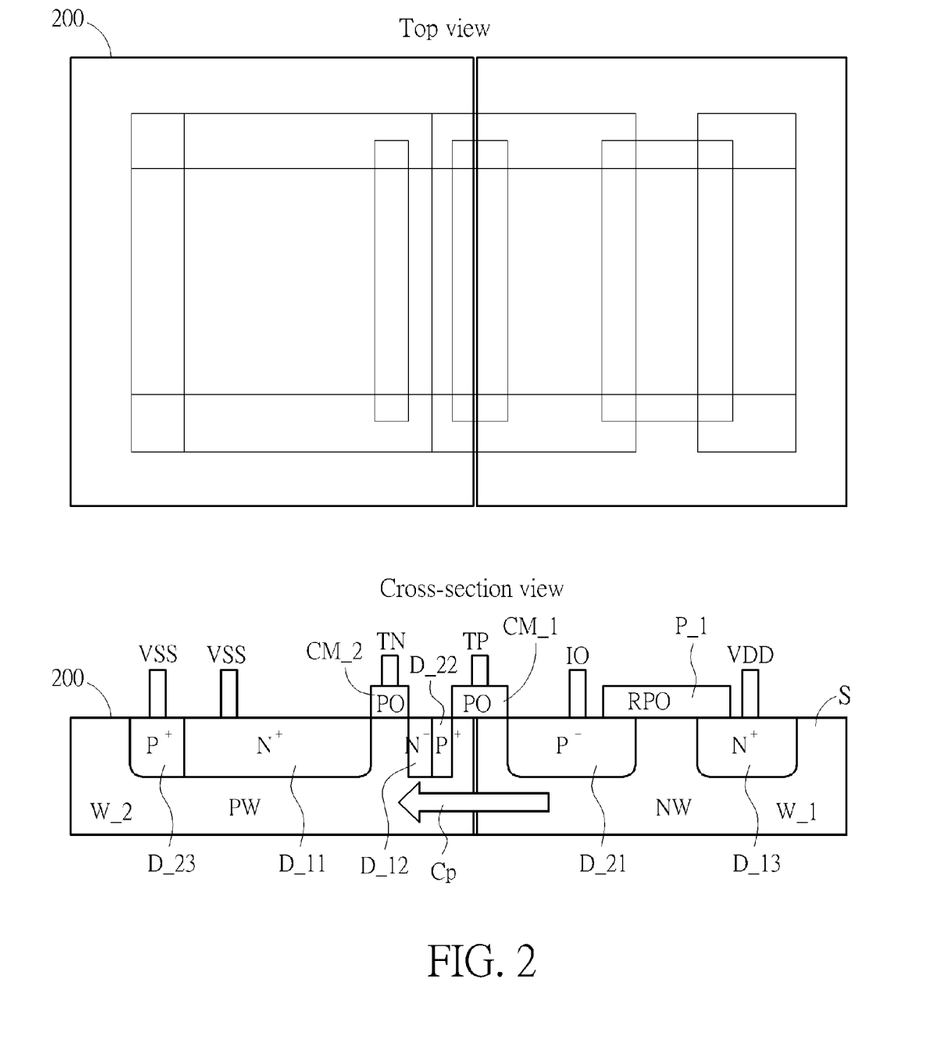
FIG. 2 to FIG. 7 are top views and cross-sectional views for semiconductor devices, without silicide, according to embodiments of the present application.

Please refer to FIG. 2, the semiconductor device 200 comprises a substrate S. The substrate S comprises: a well of type one W_1; a first doped region of type two D_21, provided in the well of type one W_1; a well of type two W_2, adjacent to the well of type one W_1; and a first doped region of type one D_11, doped in the well of type two W_2. The substrate S comprises no isolating material, such as above-mentioned STI, provided in a current path CP formed by the first doped region of type two D_21, the well of type one W_1, the well of type two W_2 and the first doped region of type one D_11. In this embodiment, the current path CP is from IO to the VSS provided to the first doped region of type one D_11.

In the embodiment of FIG. 2, the semiconductor device 200 further comprises a first conductive material CM_1 and a second conductive CM_2 (ex. poly silicide). The first conductive material CM_1 is provided on the well of type one W_1 and the well of type two W_2 but not on the first doped region of type one D_11 and the first doped region of type two D_21. Additionally, the second conductive layer CM_2 is provided on the well of type two W_2 but not on the first doped region of type one D_11. The first conductive material CM_1 and the second conductive CM_2 can receive different voltages TP, TN to assist the transmission of currents.

Moreover, the semiconductor device 200 can comprise a second doped region of type one D_12 provided in the well of type two; and a second doped region of type two D_22 provided in the well of type two W_1. The second doped region of type one D_12 and the second doped region of type two D_22 can assist the transmitting of currents. The second doped region of type two D_22 and the second doped region of type one D_12 are provided between the first doped region of type one D_11 and the first doped region of type two D_21. In such case, the first conductive material CM_1 is provided on a region between the first doped region of type two D_21 and the second doped region of type two D_22. The second conductive material CM_2 is provided on a region between the first doped region of type one D_11 and the second doped region of type one D_12.

Figure 8:
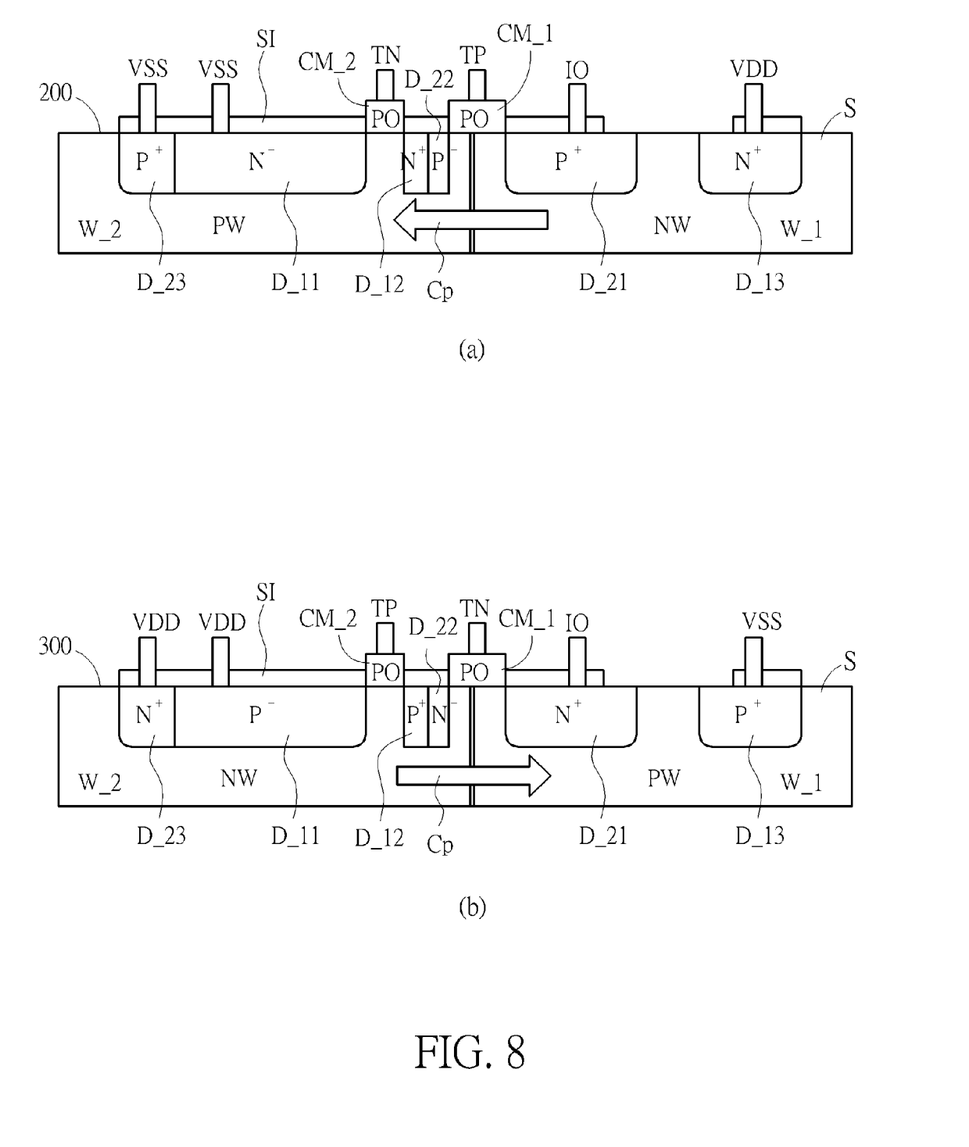
FIG. 8 to FIG. 10 are cross-sectional views for semiconductor devices, with silicide, according to embodiments of the present application.

Please note during the process manufacturing the semiconductor device 200, a protecting material P_1 can be provided as shown in FIG. 2. By this way, the silicide is not generated at the location of the protecting material P_1. Please refer to FIG. 8(a), which illustrates an embodiments that the structure in FIG. 2 further comprises silicide SI. As shown in FIG. 8(a), the silicide SI is not generated at the location of the protecting material P_1 shown in FIG. 2. For more detail, in FIG. 8(a) the silicide SI is not provided on at least part of the well of type one W_1 adjacent to the first doped region of type two D_21, and at least part of the first doped region of type two D_21 adjacent to the well of type one W_1.

Besides, the semiconductor device 200 in FIG. 2 can further comprise: a third doped region of type one D_13, doped in the well of type one W_1, not touching the first doped region of type two D_21; and a third doped region of type two D_23, doped in the well of type two W_2, touching the first doped region of type one D_11. The protecting material P_1 covers part of the third doped region of type one D_13. Therefore, in FIG. 8(a), no silicide is provided on at least part of the well of type one W_1 adjacent to the third doped region of type one D_13, and at least part of the third doped region of type one D_13 adjacent to the well of type one W_1. The third doped region of type one D_13 is coupled to an operational voltage VDD and the third doped region of type two D_23 is coupled to another operational voltage VSS in this embodiment.

Figure 3:
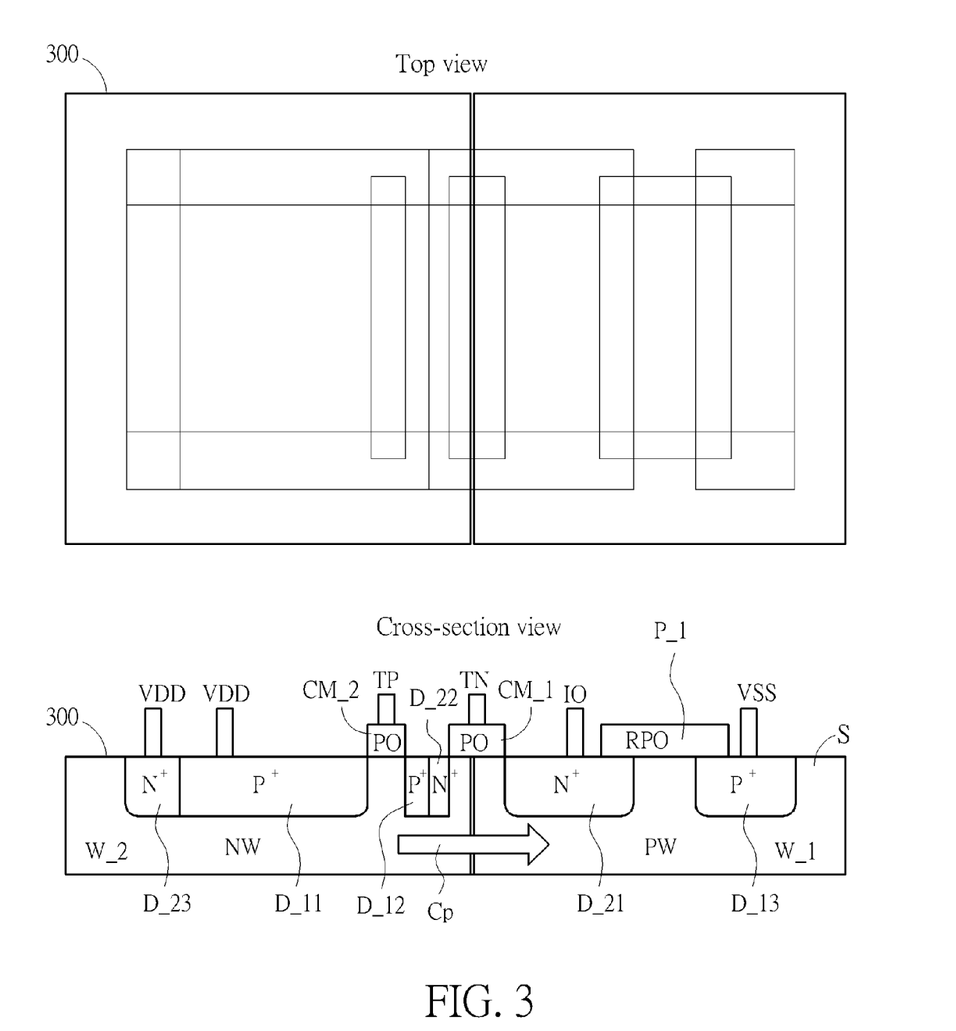

For the embodiment shown in FIG. 3, the semiconductor device 300 comprises similar structure for which of the semiconductor device 200. One of the differences is the first type is changed from the N type to the P type, and the second type is changed from the P type to the N type in FIG. 3. Additionally, the operational voltages VDD, VSS are swapped. Furthermore, current path CP is inversed, thus it is from the VDD provided to the first doped region of type one D_11 to IO. Moreover, the voltages TP, TN are swapped. FIG. 8(b) illustrates the situation that the semiconductor device 300 comprises silicide SI. Other structures and operations for the semiconductor device 300 can be clearly understood based on the description for FIG. 2, thus it is omitted for brevity here.

Figure 4:
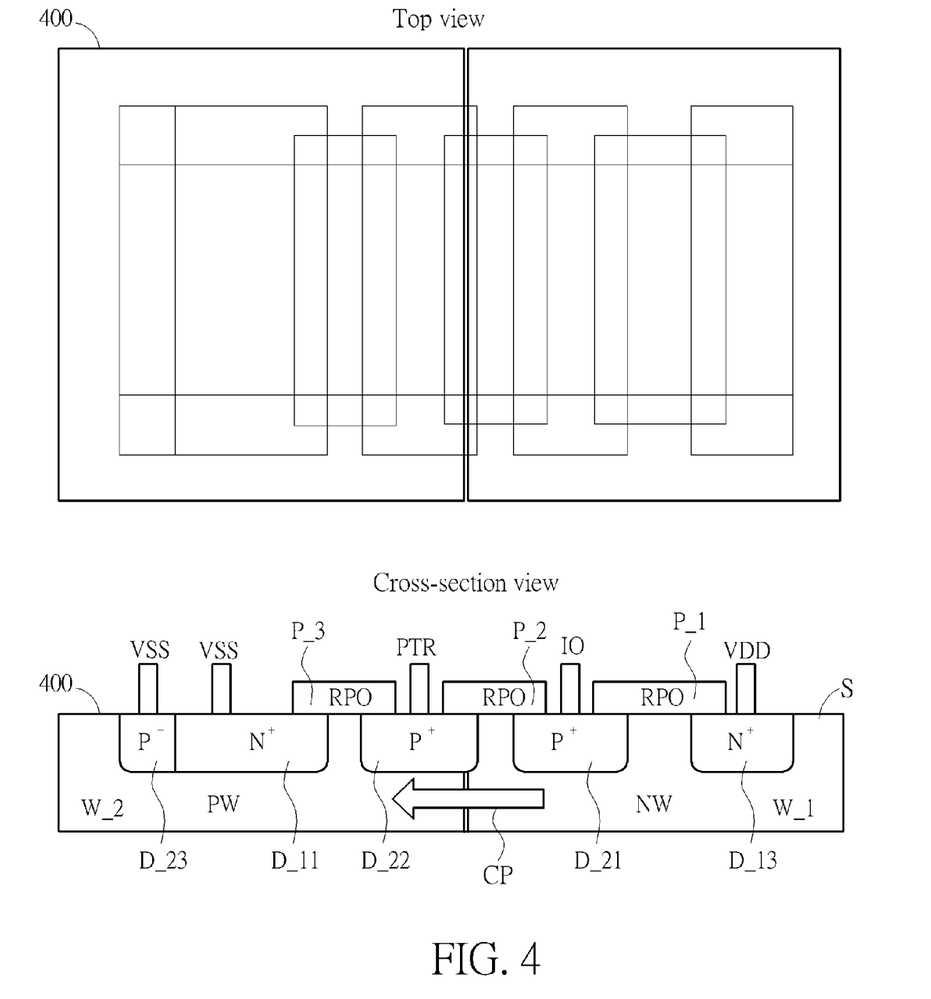

The substrate S in the semiconductor device 400 in FIG. 4 also comprises the well of type one W_1, the first doped region of type two D_21, the well of type two W_2, the first doped region of type one D_11, the third doped region of type one D_31 and the second doped region of type one D_32. However, the semiconductor device 400 comprises only the second doped region of type two D_22 rather than the first conductive material CM_1, the second conductive material CM_2, the second doped region of type one D_21 and the second doped region of type two D_22 in FIG. 2. In the semiconductor device 400, the second doped region of type two D_22 does not touch the first doped region of type one D_11 and the first doped region of type two D_21. Additionally, the second doped region of type two D_22 in FIG. 4 receives a voltage PTR to assist transmitting the current.

Figure 9:
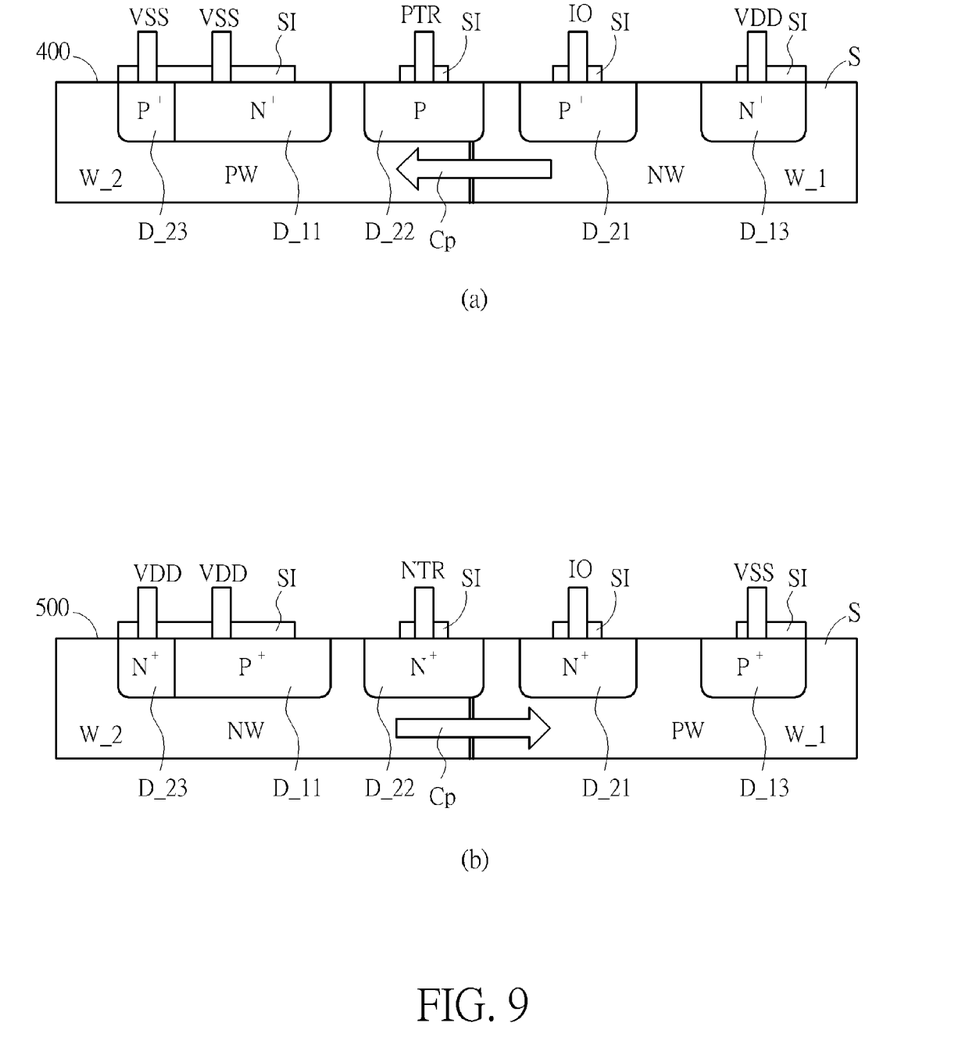

During the manufacturing of the semiconductor device 400, the semiconductor device 400 also comprises protecting material P_1. Besides, the semiconductor device 400 further comprises the protecting material P_2 and the protecting material P_3. The protecting material P_2 is provided on at least part of the first doped region of type two D_21, at least part of the second doped region of type two D_22, and at least part of the well of type one W_1 between the first doped region of type two D_21 and the second doped region of type two D_22. The protecting material P_3 is provided on at least part of the first doped region of type one D_11, at least part of the second doped region of type two D_22, and at least part of the well of type two between the first doped region of type one D_11 and the second doped region of type two D_22. Therefore, the silicide SI is not provided at the locations for the protecting materials P_1, P_2 and P_3, as shown in FIG. 9(a).

Figure 5:
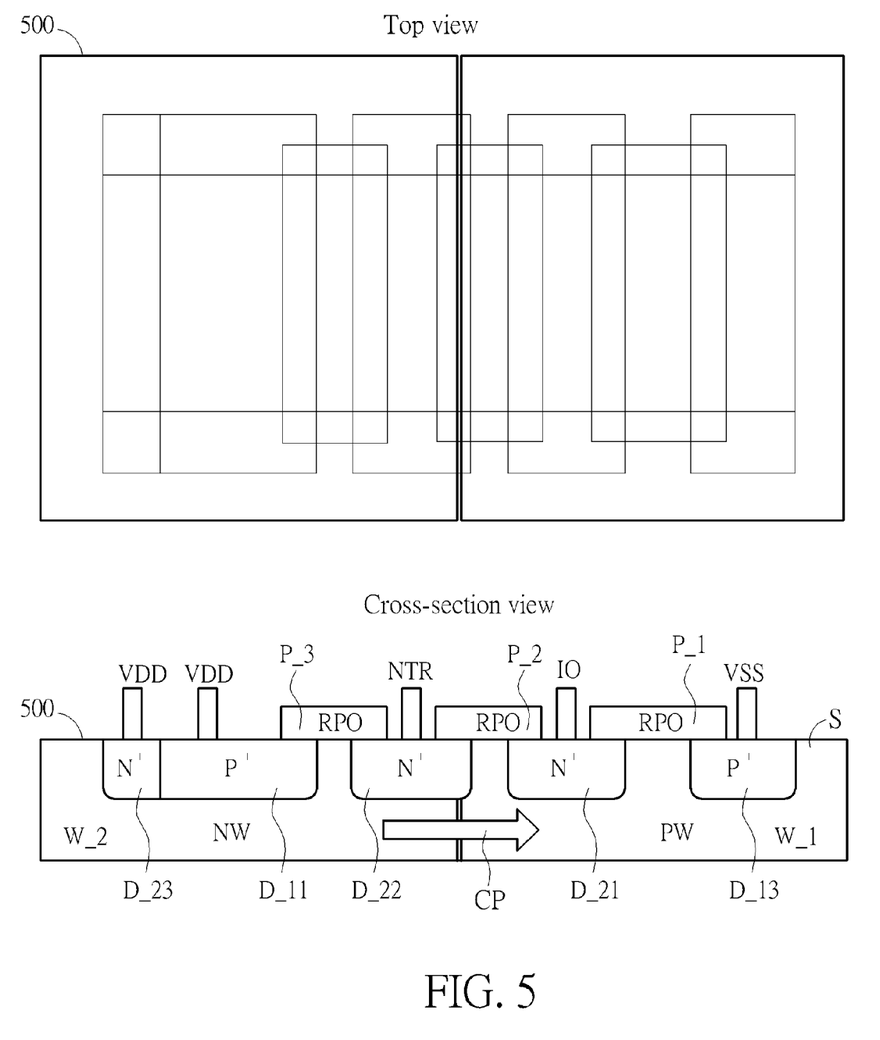

The semiconductor device 500 in FIG. 5 comprises similar structure for which of the semiconductor device 400. One of the differences is the first type is changed from the N type to the P type, and the second type is changed from the P type to the N type in FIG. 5. Additionally, the operational voltages VDD, VSS are swapped. Furthermore, current path CP is inversed, thus it is from the VDD provided to the first doped region of type one D_11 to 10. FIG. 9(b) illustrates the situation that the semiconductor device 500 comprises silicide SI. Other structures and operations for the semiconductor device 500 can be clearly understood based on the description for FIG. 4, thus it is omitted for brevity here.

Figure 6:
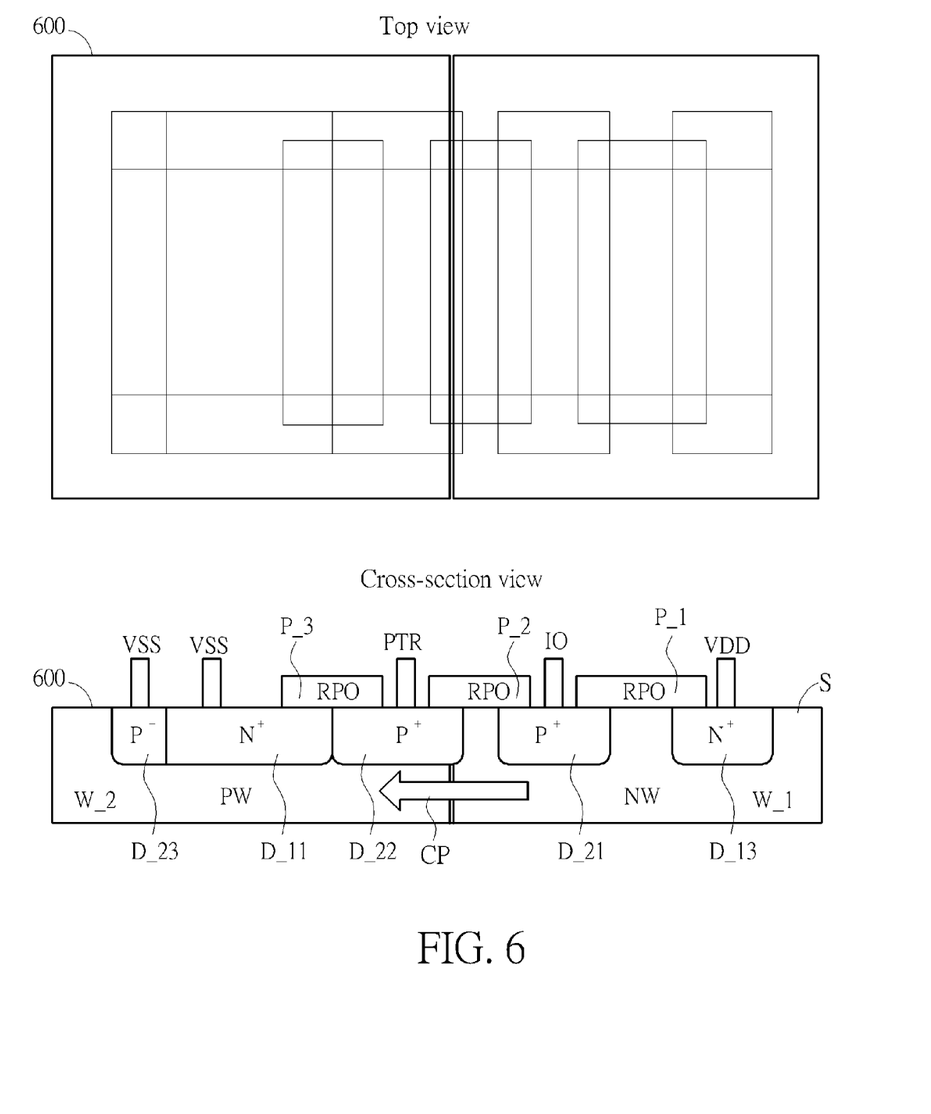
Figure 10:
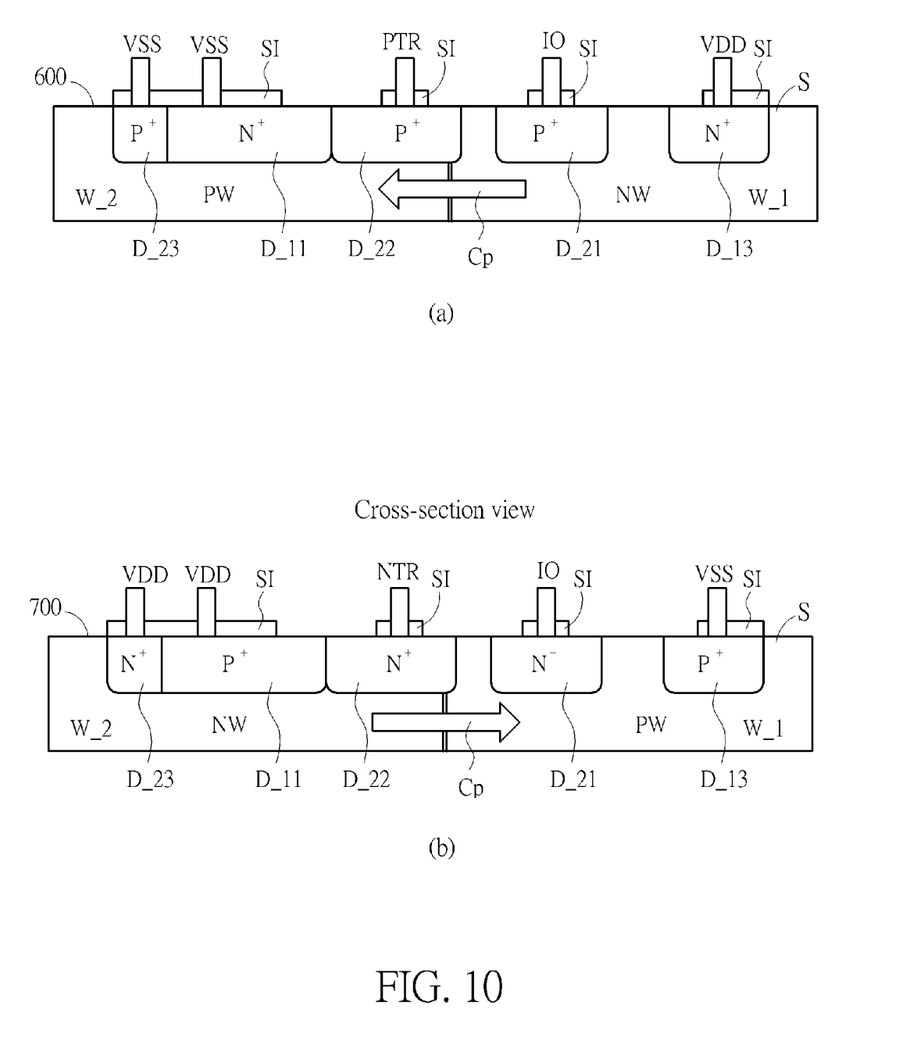

FIG. 6 is a schematic diagram illustrating a semiconductor device 600 according to another embodiment of the present application. The only difference between the embodiments in FIG. 4 and FIG. 6 is that the second doped region of type two D_22 does not touch the first doped region of type one D_11 in FIG. 4, but the second doped region of type two D_22 touches (or overlaps) the first doped region of type one D_11 in FIG. 6. Therefore, the protecting material P_3 in FIG. 6 is provided on at least part of the first doped region of type one D_11, and at least part of the second doped region of type two D_22. The silicide SI is not provided at the locations for the protecting materials P_1, P_2 and P_3 of FIG. 6, as shown in FIG. 10(a).

Figure 7:
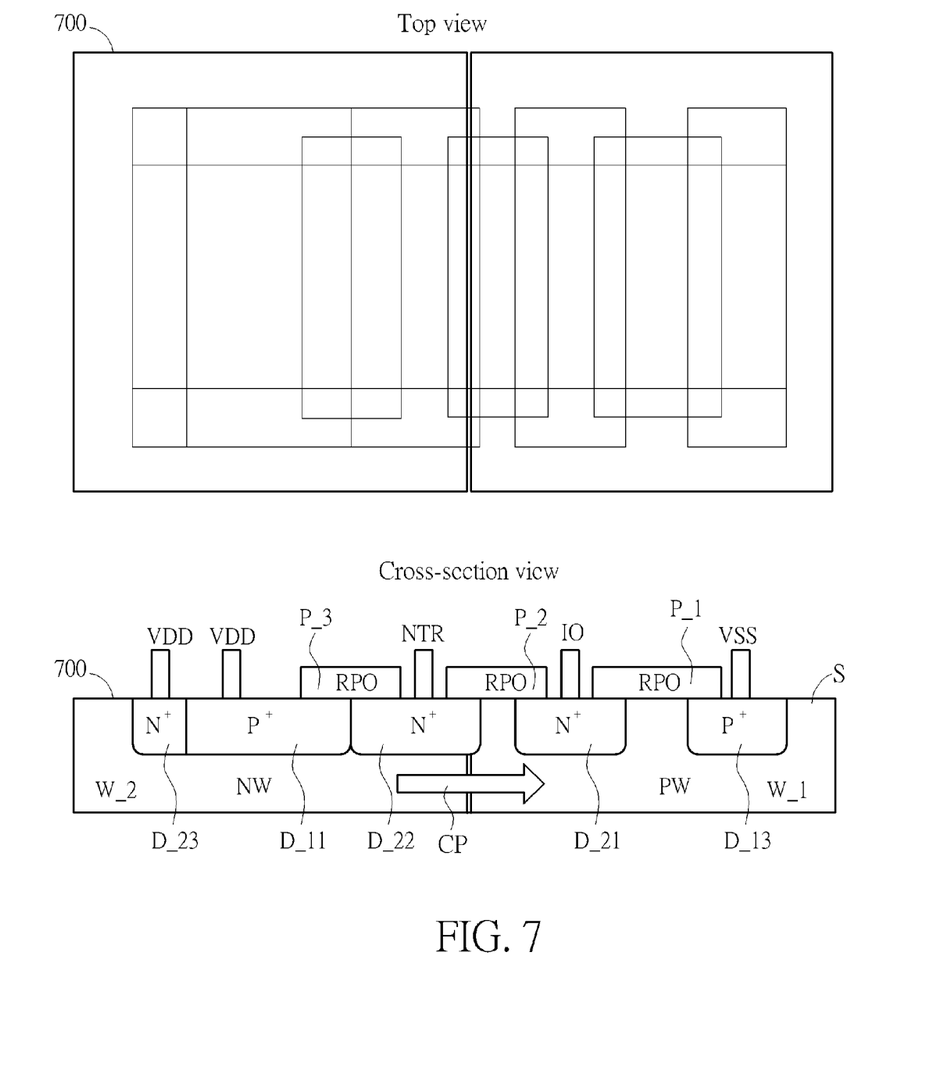

The semiconductor device 700 in FIG. 7 comprises similar structure for which of the semiconductor device 600. One of the differences is the first type is changed from the N type to the P type, and the second type is changed from the P type to the N type in FIG. 6. Additionally, the operational voltages VDD, VSS are swapped. Furthermore, current path CP is inversed, thus it is from the VDD provided to the first doped region of type one D_11 to IO. FIG. 10(b) illustrates the situation that the semiconductor device 700 comprises silicide. Other structures and operations for the semiconductor device 700 can be clearly understood based on the description for FIG. 6, thus it is omitted for brevity here.

Figure 11:
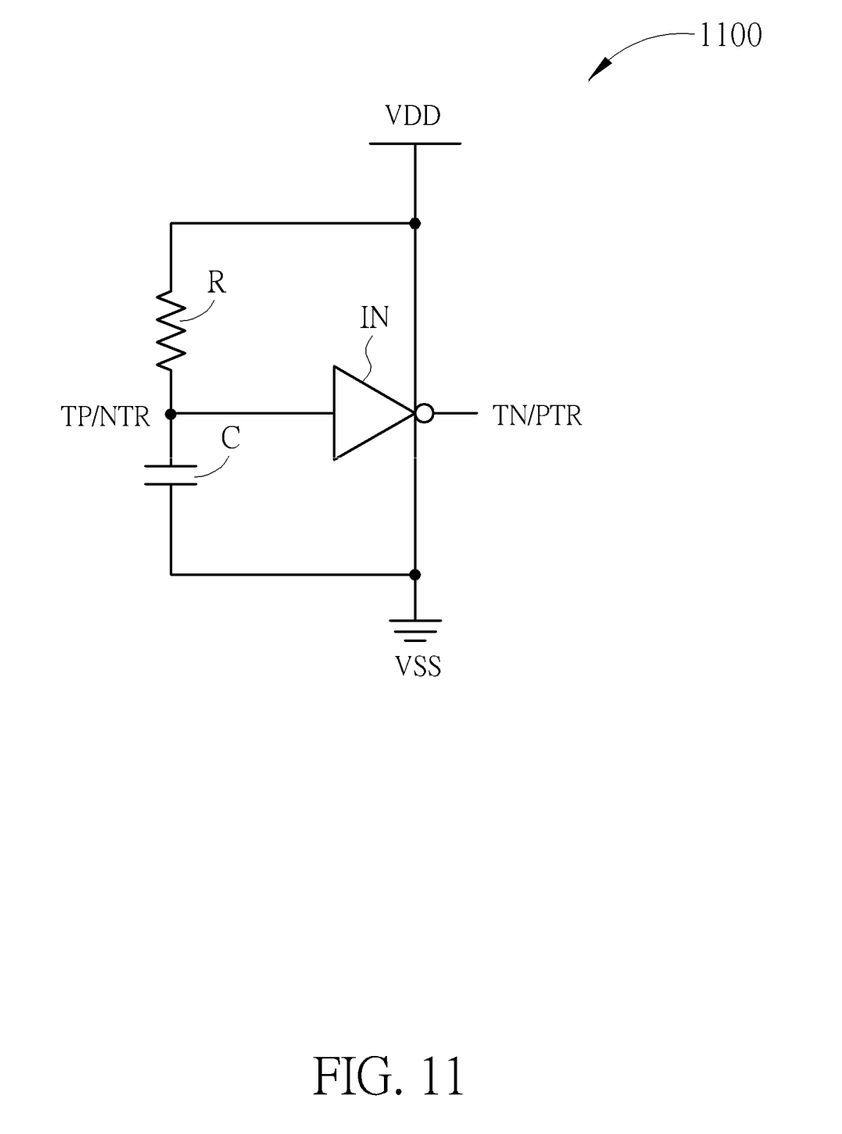
FIG. 11 is a circuit diagram illustrating a voltage providing circuit for providing voltages to the semiconductor devices disclosed in the present application, according to one embodiment of the present application.

The voltages TP, TN in FIG. 2 and FIG. 3, and the voltages PTR, NTR in FIG. 4-FIG. 7, are applied for assisting the transmitting of the currents, as above-mentioned. The values thereof depend on the types of channels for the current path. In the embodiments of FIG. 2-FIG. 7, the voltage TN is higher than the voltage TP, and the voltage PTR is higher than the voltage NTR. FIG. 11 is a circuit diagram illustrating a voltage providing circuit 1100 for providing voltages to the semiconductor devices disclosed in the present application, according to one embodiment of the present application. As shown in FIG. 11, the voltage providing circuit 1100 is a RC inverter. A higher voltage, such as TN or PTR can be derived from the output of the voltage providing circuit 1100, and a lower voltage, such as TP or NTR, can be derived from the input of the voltage providing circuit 1100. Please note the circuit for providing the voltages TP, TN, PTR, NTR are not limited to the circuit structure shown in FIG. 11.

In view of the above-mentioned embodiments, no STI is provided between P doped region and the N doped region, thus the current path is shorter and the discharging time for the semiconductor device is reduced. Also, voltage assisting the current transmitting can be provided to the semiconductor device. By this way, the circuit need to be protected can be well protected if the disclosed semiconductor device is applied as an ESD device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, comprising:
      a well of type one;
      a first doped region of type two, provided in the well of type one;
      a well of type two, adjacent to the well of type one;
      a first doped region of type one, doped in the well of type two;
      a second doped region of type two, provided in the well of type one and the well of type two, not touching the first doped region of type two;
      a third doped region of type one, provided in the well of type one; and
      a protecting material, provided on the well of type one, wherein the protecting material covers part of the third doped region of type one, part of the first doped region of type two and a region of the well of type one between the third doped region of type one and the first doped region of type two,
   wherein the substrate comprises no isolating material provided in a current path formed by the first doped region of type two, the well of type one, the well of type two and the first doped region of type one.

2. The semiconductor device of claim 1, wherein no silicide is provided on at least part of the well of type one adjacent to the first doped region of type two, and at least part of the first doped region of type two adjacent to the well of type one.

3. The semiconductor device of claim 1, wherein the third doped region of type one does not touch the first doped region of type two, wherein the semiconductor device further comprises:
   a third doped region of type two, doped in the well of type two, touching the first doped region of type one.

4. The semiconductor device of claim 3, wherein the second doped region of type two does not physically touch the first doped region of type one.

5. The semiconductor device of claim 4, wherein no silicide is provided on at least part of the first doped region of type two, at least part of the second doped region of type two, and at least part of the well of type one between the first doped region of type two and the second doped region of type two.

6. The semiconductor device of claim 3, wherein the second doped region of type two physically touches the first doped region of type one.

7. The semiconductor device of claim 6, wherein no silicide is provided on at least part of the first doped region of type one, at least part of the second doped region of type two.

8. The semiconductor device of claim 3, wherein no silicide is provided on at least part of the well of type one adjacent to the third doped region of type one, and at least part of the third doped region of type one adjacent to the well of type one.

9. The semiconductor device of claim 1, wherein the type one is N type and the type two is P type.

10. The semiconductor device of claim 1, wherein the type one is P type and the type two is N type.

11. The semiconductor device of claim 8, further comprising:
    a second doped region of type two, provided in the well of type one and the well of type two, not touching the first doped region of type two.

12. The semiconductor device of claim 11, wherein the third doped region of type one does not touch the first doped region of type two, wherein the semiconductor device further comprises:
    a third doped region of type two, doped in the well of type two, touching the first doped region of type one.

13. The semiconductor device of claim 12, wherein the second doped region of type two does not physically touch the first doped region of type one.

14. The semiconductor device of claim 13, wherein no silicide is provided on at least part of the first doped region of type two, at least part of the second doped region of type two, and at least part of the well of type one between the first doped region of type two and the second doped region of type two.

15. The semiconductor device of claim 12, wherein the second doped region of type two physically touches the first doped region of type one.

16. The semiconductor device of claim 15, wherein no silicide is provided on at least part of the first doped region of type one, and at least part of the second doped region of type two.

17. The semiconductor device of claim 12, wherein no silicide is provided on at least part of the well of type one adjacent to the third doped region of type one, and at least part of the third doped region of type one adjacent to the well of type one.

18. A semiconductor device, comprising:
    a substrate, comprising:
       a well of type one;
       a first doped region of type two, provided in the well of type one;
       a well of type two, adjacent to the well of type one;
       a first doped region of type one, doped in the well of type two;
       a third doped region of type one, provided in the well of type one; and
       a protecting material, provided on the well of type one, wherein the protecting material covers part of the third doped region of type one, part of the first doped region of type two and a region of the well of type one between the third doped region of type one and the first doped region of type two,
    wherein no silicide is provided on at least part of the well of type one adjacent to the first doped region of type two, and at least part of the first doped region of type two adjacent to the well of type one;
    wherein the substrate comprises no isolating material provided in a current path formed by the first doped region of type two, the well of type one, the well of type two and the first doped region of type one.

19. The semiconductor device of claim 18, wherein the type one is N type and the type two is P type.

20. The semiconductor device of claim 18, wherein the type one is P type and the type two is N type.

\* \* \* \* \*